(12) United States Patent
Kim

(10) Patent No.: US 11,171,637 B2
(45) Date of Patent: Nov. 9, 2021

(54) SEMICONDUCTOR DEVICES

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/597,610

(22) Filed: Oct. 9, 2019

(65) Prior Publication Data

US 2020/0287527 A1      Sep. 10, 2020

(30) Foreign Application Priority Data

Mar. 5, 2019  (KR) .................. 10-2019-0025318

(51) Int. Cl.
| | |
|---|---|
| *H03K 5/133* | (2014.01) |
| *H03K 5/06* | (2006.01) |
| *H03K 5/156* | (2006.01) |
| *H03K 5/00* | (2006.01) |

(52) U.S. Cl.
CPC ............. *H03K 5/133* (2013.01); *H03K 5/06* (2013.01); *H03K 5/1565* (2013.01); *H03K 2005/0028* (2013.01)

(58) Field of Classification Search
CPC ........ H03K 5/133; H03K 5/06; H03K 5/1565; H03K 2005/0028; H03M 1/50
See application file for complete search history.

(56) References Cited

U.S. PATENT DOCUMENTS

| | | | | |
|---|---|---|---|---|
| 4,366,481 A | * | 12/1982 | Main ...................... | G07F 9/002 340/10.41 |
| 8,116,155 B2 | * | 2/2012 | Baek ...................... | G11C 29/02 365/194 |
| 8,884,685 B1 | | 11/2014 | Petrovic | |

FOREIGN PATENT DOCUMENTS

KR     10-2010-0116012     10/2010

* cited by examiner

*Primary Examiner* — Sibin Chen
(74) *Attorney, Agent, or Firm* — IP & T Group LLP

(57) ABSTRACT

A semiconductor device includes a test clock generation circuit, a test data generation circuit, and a control code generation circuit. The test clock generation circuit delays a clock signal based on a delay selection signal in a test mode to generate a test clock signal. The test data generation circuit delays data to generate test data. The control code generation circuit latches the test data based on the delay selection signal and the test clock signal to generate a control code.

13 Claims, 17 Drawing Sheets

SEMICONDUCTOR DEVICES

CROSS-REFERENCE TO RELATED APPLICATIONS

The present application claims priority under 35 U.S.C 119(a) to Korean Application No. 10-2019-0025318, filed on Mar. 5, 2019, which is incorporated herein by reference in its entirety.

BACKGROUND

1. Technical Field

Various embodiments of the present disclosure generally relate to semiconductor devices compensating for degradation of reliability of transistors.

2. Related Art

Semiconductor devices may be designed using various semiconductor components, for example, N-channel metal-oxide-semiconductor (NMOS) transistors and P-channel metal-oxide-semiconductor (PMOS) transistors. As the lifespan of a semiconductor device increases, characteristics of the semiconductor components included in the semiconductor device may change to degrade the reliability of the semiconductor device or to cause malfunction of the semiconductor device. The degradation of the semiconductor components may be typically due to a hot carrier injection (HCI) phenomenon, a time-dependent dielectric breakdown (TDDB) phenomenon, or a bias temperature instability (BTI) phenomenon.

The BTI phenomenon may include a negative bias temperature instability (NBTI) phenomenon and a positive bias temperature instability (PBTI) phenomenon. The NBTI phenomenon causes an increase of a threshold voltage of NMOS transistors to reduce drain currents of the NMOS transistors, and the PBTI phenomenon causes an increase of a threshold voltage of PMOS transistors to reduce drain currents of the PMOS transistors. When a pulse signal is generated by a delay circuit, if MOS transistors included in the delay circuit are degraded due to the BTI phenomenon, a pulse width of the pulse signal may increase to cause malfunction of a semiconductor device including the delay circuit.

SUMMARY

According to an embodiment, a semiconductor device includes a test clock generation circuit, a test data generation circuit, and a control code generation circuit. The test clock generation circuit is configured to delay a clock signal based on a delay/selection signal in a test mode to generate a test clock signal. The test data generation circuit is configured to delay data to generate test data. The control code generation circuit is configured to latch the test data based on the delay/selection signal and the test clock signal to generate a control code.

According to another embodiment, a semiconductor device includes a first latched data generation circuit, a second latched data generation circuit, and a mode register. The first latched data generation circuit is configured to latch test data based on a first delay/selection signal and a test clock signal and is configured to output the latched test data as first latched data. The second latched data generation circuit is configured to latch the test data based on a second delay/selection signal and the test clock signal and is configured to output the latched test data as second latched data. The mode register is configured to store the first and second latched data and is configured to output the stored data of the first latched data and the stored data of the second latched data as a first control code and a second control code.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

It is noted that reference to "an embodiment," "another embodiment" or the like does not necessarily mean only one embodiment, and different references to any such phrase are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

Figure 1:
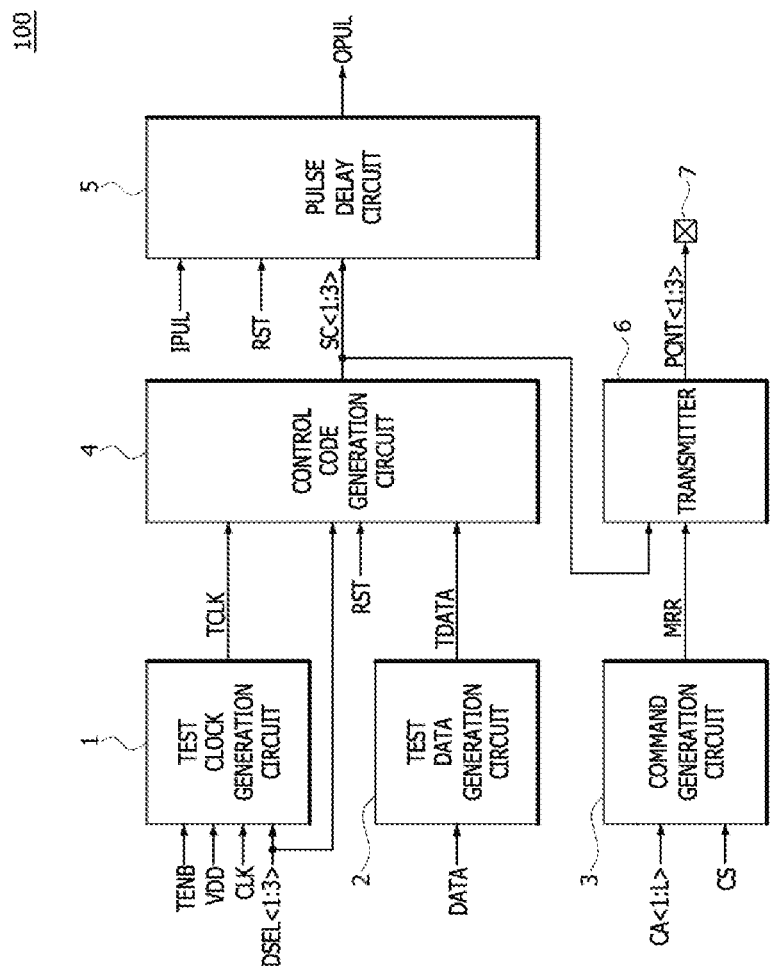
FIG. 1 is a block diagram illustrating a semiconductor device according to an embodiment of the present disclosure.

FIG. 1 is a block diagram illustrating a semiconductor device 100 according to an embodiment of the present disclosure. Referring to FIG. 1, the semiconductor device 100 may include a test clock generation circuit 1, a test data generation circuit 2, a command generation circuit 3, a control code generation circuit 4, a pulse delay circuit 5, a transmitter 6, and an output pad 7.

The test clock generation circuit 1 may generate a test clock signal TCLK based on a test enablement signal TENB, a clock signal CLK, and a delay selection signal DSEL<1:3>. The test enablement signal TENB may be activated when entering a test mode for compensating for degradation of MOS transistors due to the BTI phenomenon. The delay selection signal DSEL<1:3> may represent first to third delay selection signals DSEL<1:3>. The test clock generation circuit 1 may delay the clock signal CLK by a delay amount that is controlled by a code value of the first to third delay selection signals DSEL<1:3>, to generate the test clock signal TCLK when the test mode is entered. An activation level of the test enablement signal TENB may be set differently according to embodiments. A pulse width of the test clock signal TCLK may increase as MOS transistors in the test clock generation circuit 1 are degraded according to variations of processes, voltages and/or temperatures (PVT).

The test data generation circuit 2 may generate test data TDATA based on data DATA. The test data generation circuit 2 may include a delay circuit including a plurality of MOS transistors. The test data generation circuit 2 may delay the data DATA to generate the test data TDATA. A pulse width of the test data TDATA may increase as the MOS transistors in the test data generation circuit 2 are degraded by the PVT variations and by the BTI phenomenon.

The command generation circuit 3 may generate a mode register read command MRR based on first to $L^{th}$ information signals CA<1:L>, and a chip selection signal CS. The command generation circuit 3 may generate the mode register read command MRR when the first to $L^{th}$ information signals CA<1:L> have a predetermined code value and the chip selection signal CS has a predetermined logic level. The mode register read command MRR may be activated to perform a mode register read operation. The predetermined logic level of the chip selection signal CS and the predetermined code value of the first to $L^{th}$ information signals CA<1:L> for generating (or activating) the mode register read command MRR may be set differently according to the embodiments. The first to $L^{th}$ information signals CA<1:L> may include information for generating a command and an address.

The control code generation circuit 4 may generate first to third control codes SC<1:3> based on the test clock signal TCLK, the first to third delay selection signals DSEL<1:3>, a reset signal RST, and the test data TDATA. The reset signal RST may be activated to perform an initialization operation. The control code generation circuit 4 may latch and store the test data TDATA in response to the test clock signal TCLK and the first to third delay selection signals DSEL<1:3>, and may generate the first to third control codes SC<1:3> based on the latched test data TDATA.

The pulse delay circuit 5 may generate an output pulse signal OPUL based on an internal pulse signal IPUL, the first to third control codes SC<1:3>, and the reset signal RST. The pulse delay circuit 5 may delay the internal pulse signal IPUL to generate the output pulse signal OPUL. A pulse width of the output pulse signal OPUL is controlled by the first to third control codes SC<1:3>. The pulse width of the output pulse signal OPUL controlled by a code value of the first to third control codes SC<1:3> may be set to be different according to the embodiments.

The transmitter 6 may generate first to third transmission codes PCNT<1:3> based on the first to third control codes SC<1:3> and the mode register read command MRR, and may output the first to third transmission codes PCNT<1:3> through the output pad 7. That is, the transmitter 6 may buffer or amplify the first to third control codes SC<1:3> to generate the first to third transmission codes PCNT<1:3> when the mode register read command MRR is activated. The output pad 7 may be a data pad through which data are outputted. An incremental amount of a pulse width of the internal pulse signal IPUL due to the BTI phenomenon may be determined by a code value of the first to third transmission codes PCNT<1:3> outputted through the output pad 7.

Figure 2:
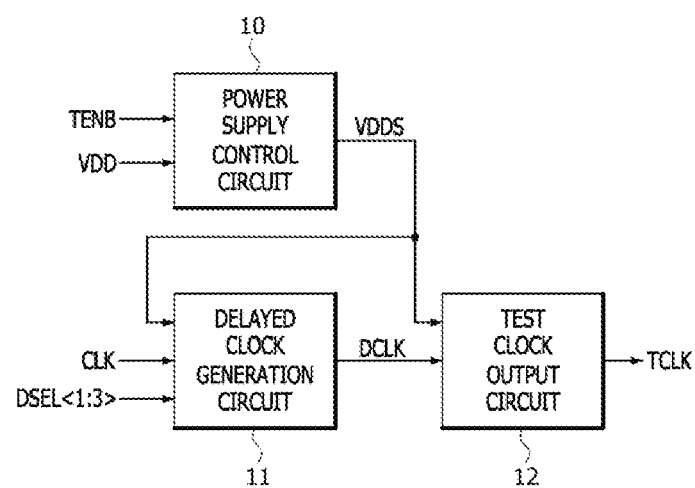
FIG. 2 is a detailed diagram of a test clock generation circuit, such as that included in the semiconductor device shown in FIG. 1.

FIG. 2 is a detailed diagram of the test clock generation circuit 1 included in the semiconductor device 100 shown in FIG. 1. Referring to FIG. 2, the test clock generation circuit 1 may include a power supply control circuit 10, a delayed clock generation circuit 11, and a test clock output circuit 12.

The power supply control circuit 10 may receive a power source voltage VDD and may generate a supply voltage VDDS in response to the test enablement signal TENB. The power supply control circuit 10 may drive a terminal of the supply voltage VDDS with the power source voltage VDD when the test enablement signal TENB is activated during the test mode. Since the test clock generation circuit 1 operates merely during a specific test mode, MOS transistors included in the test clock generation circuit 1 may not be affected (i.e., degraded) by the BTI phenomenon (i.e., aging-related index) but only be affected by the PVT variation (i.e., non-aging-related index). A configuration and an operation of the power supply control circuit 10 will be described more fully with reference to FIG. 3 later.

The delayed clock generation circuit 11 may receive the supply voltage VDDS to operate. The delayed clock generation circuit 11 may delay the clock signal CLK by a delay amount determined by a code value of the first to third delay selection signals DSEL<1:3> to generate a delayed clock signal DCLK in the test mode.

The test clock output circuit 12 may receive the supply voltage VDDS to operate. The test clock output circuit 12 may delay the delayed clock signal DCLK to generate the test clock signal TCLK in the test mode.

Figure 3:
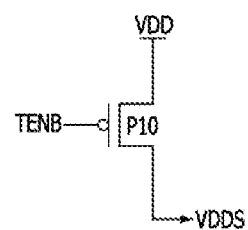
FIG. 3 is a detailed diagram of a power supply control circuit, such as that included in the test clock generation circuit shown in FIG. 2.

FIG. 3 is a detailed diagram of the power supply control circuit 10 included in the test clock generation circuit 1 shown in FIG. 2. Referring to FIG. 3, the power supply control circuit 10 may include a PMOS transistor P10. The PMOS transistor P10 may be turned on when the test enablement signal TENB is activated to a logic "low" level during the test mode. The PMOS transistor P10 may drive the terminal of the supply voltage VDDS to the power source voltage VDD when the PMOS transistor P10 is turned on in the test mode.

Figure 4:
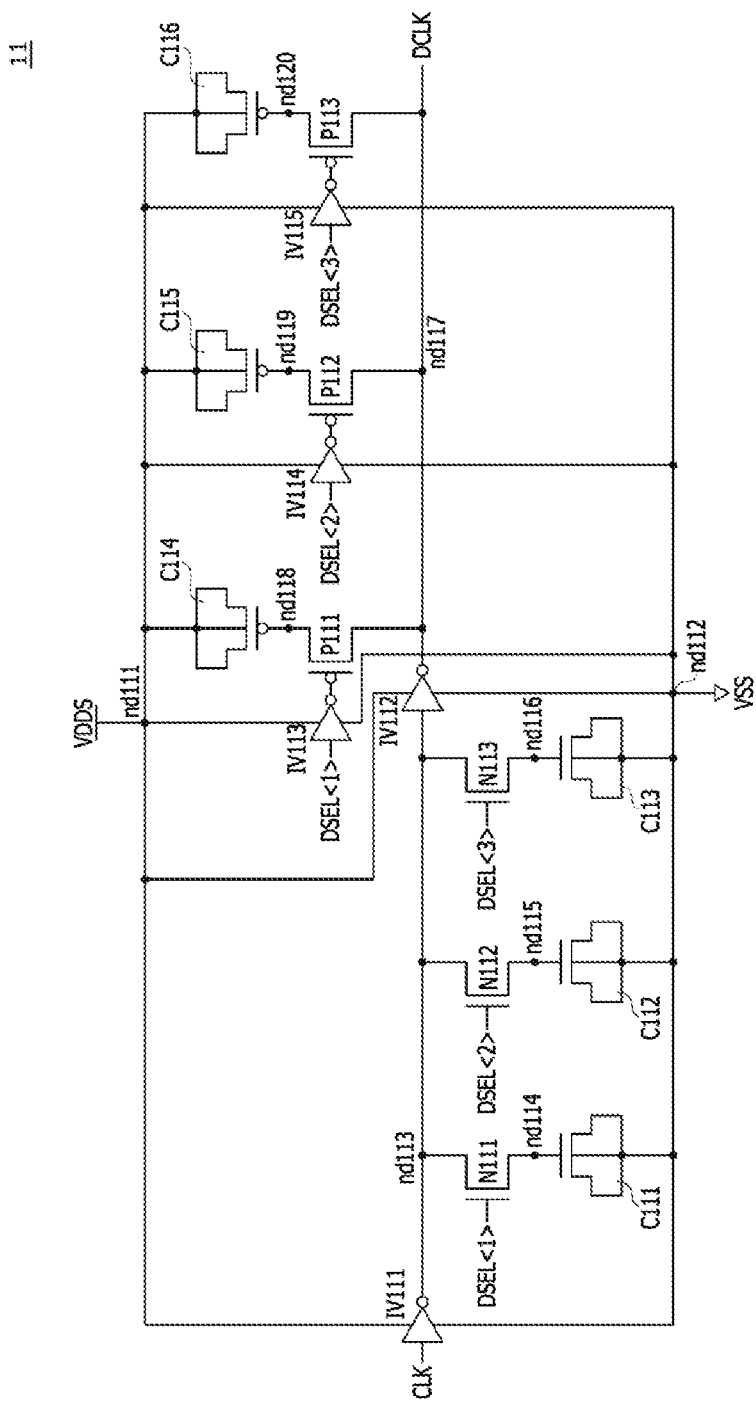
FIG. 4 is a detailed diagram of a delayed clock generation circuit, such as that included in the test clock generation circuit shown in FIG. 2.

FIG. 4 is a detailed diagram of the delayed clock generation circuit 11 included in the test clock generation circuit 1 shown in FIG. 2. Referring to FIG. 4, the delayed clock generation circuit 11 may include inverters IV111, IV112, IV113, IV114, and IV115, NMOS transistors N111, N112, and N113, capacitors C111, C112, C113, C114, C115, and C116, and PMOS transistors P111, P112, and P113.

The inverter IV111 may receive the supply voltage VDDS and a ground voltage VSS to operate. The supply voltage VDDS may be supplied to a node nd111 serving as a supply voltage terminal (i.e., the terminal of the supply voltage VDDS), and the ground voltage VSS may be supplied to a node nd112 serving as a ground voltage terminal. The inverter IV111 may inversely buffer the clock signal CLK to output the inversely buffered clock signal to a node nd113. The inverter IV112 may receive the supply voltage VDDS and the ground voltage VSS to operate, and may inversely buffer a signal of the node nd113 to output the inversely buffered signal of the signal of the node nd113 to a node nd117. The inverter IV113 may receive the supply voltage VDDS and the ground voltage VSS to operate, and may inversely buffer the first delay selection signal DSEL<1>. The inverter IV114 may receive the supply voltage VDDS and the ground voltage VSS to operate, and may inversely buffer the second delay selection signal DSEL<2>. The inverter IV115 may receive the supply voltage VDDS and the ground voltage VSS to operate, and may inversely buffer the third delay selection signal DSEL<3>.

The NMOS transistor N111 may be coupled between the node nd113 and a node nd114, and may be turned on when the first delay selection signal DSEL<1> has a logic "high" level. The capacitor C111 may be coupled between the node nd114 and the node nd112. The capacitor C111 may be realized using an NMOS transistor of which a source terminal and a drain terminal are connected to the node nd112 having a level of the ground voltage VSS. The NMOS transistor N112 may be coupled between the node nd113 and a node nd115, and may be turned on when the second delay selection signal DSEL<2> has a logic "high" level. The capacitor C112 may be coupled between the node nd115 and the node nd112. The capacitor C112 may be realized using an NMOS transistor of which a source terminal and a drain terminal are connected to the node nd112 having a level of the ground voltage VSS. The NMOS transistor N113 may be coupled between the node nd113 and a node nd116, and may be turned on when the third delay selection signal DSEL<3> has a logic "high" level. The capacitor C113 may be coupled between the node nd116 and the node nd112. The capacitor C113 may be realized using an NMOS transistor of which a source terminal and a drain terminal are connected to the node nd112 having a level of the ground voltage VSS. In the present embodiment, a capacitance value of the capacitor C113 may be set greater than a capacitance value of the capacitor C112, and the capacitance value of the capacitor C112 may be set greater than a capacitance value of the capacitor C111.

The PMOS transistor P111 may be coupled between a node nd118 and the node nd117, and may be turned on by an output signal (having a logic "low" level) of the inverter IV113 when the first delay selection signal DSEL<1> has a logic "high" level. The capacitor C114 may be coupled between the node nd118 and the node nd111. The capacitor C114 may be realized using a PMOS transistor of which a source terminal and a drain terminal are connected to the node nd111 having a level of the supply voltage VDDS. The PMOS transistor P112 may be coupled between a node nd119 and the node nd117, and may be turned on by an output signal (having a logic "low" level) of the inverter IV114 when the second delay selection signal DSEL<2> has a logic "high" level. The capacitor C115 may be coupled between the node nd119 and the node nd111. The capacitor C115 may be realized using a PMOS transistor of which a source terminal and a drain terminal are connected to the node nd111 having a level of the supply voltage VDDS. The PMOS transistor P113 may be coupled between a node nd120 and the node nd117, and may be turned on by an output signal (having a logic "low" level) of the inverter IV115 when the third delay selection signal DSEL<3> has a logic "high" level. The capacitor C116 may be coupled between the node nd120 and the node nd111. The capacitor C116 may be realized using a PMOS transistor of which a source terminal and a drain terminal are connected to the node nd111 having a level of the supply voltage VDDS. In the present embodiment, a capacitance value of the capacitor C116 may be set greater than a capacitance value of the capacitor C115, and the capacitance value of the capacitor C115 may be set greater than a capacitance value of the capacitor C114.

The delayed clock generation circuit 11 does not operate when the test mode is exited. This is because the supply voltage VDDS is not supplied to the delayed clock generation circuit 11 when the test mode is exited. The delayed clock generation circuit 11 may receive the supply voltage VDDS and the ground voltage VSS in the test mode, and may delay the clock signal CLK by a delay amount determined by a code value of the first to third delay selection signals DSEL<1:3> to generate the delayed clock signal DCLK. For example, when the first delay selection signal DSEL<1> has a logic "high" level and the second and third delay selection signals DSEL<2:3> have a logic "low" level, the delay amount of the delayed clock signal DCLK is determined by the capacitors C111 and C114. Further, when the second delay selection signal DSEL<2> has a logic "high" level and the first and third delay selection signals DSEL<1> and DSEL<3> have a logic "low" level, the delay amount of the delayed clock signal DCLK is determined by the capacitors C112 and C115. Further, when the third delay selection signal DSEL<3> has a logic "high" level and the first and second delay selection signals DSEL<1:2> have a logic "low" level, the delay period of the delayed clock signal DCLK is determined by the capacitors C113 and C116. A delay amount by which the delayed clock generation circuit 11 delays the clock signal CLK when the third delay selection signal DSEL<3> has a logic "high" level may be greater than a delay amount by which the delayed clock generation circuit 11 delays the clock signal CLK when the second delay selection signal DSEL<2> has a logic "high" level. In the present embodiments, a delay amount determined when the second delay selection signal DSEL<2> has a logic "high" level may be greater than a delay amount determined when the first delay selection signal DSEL<1> has a logic "high" level.

Figure 5:
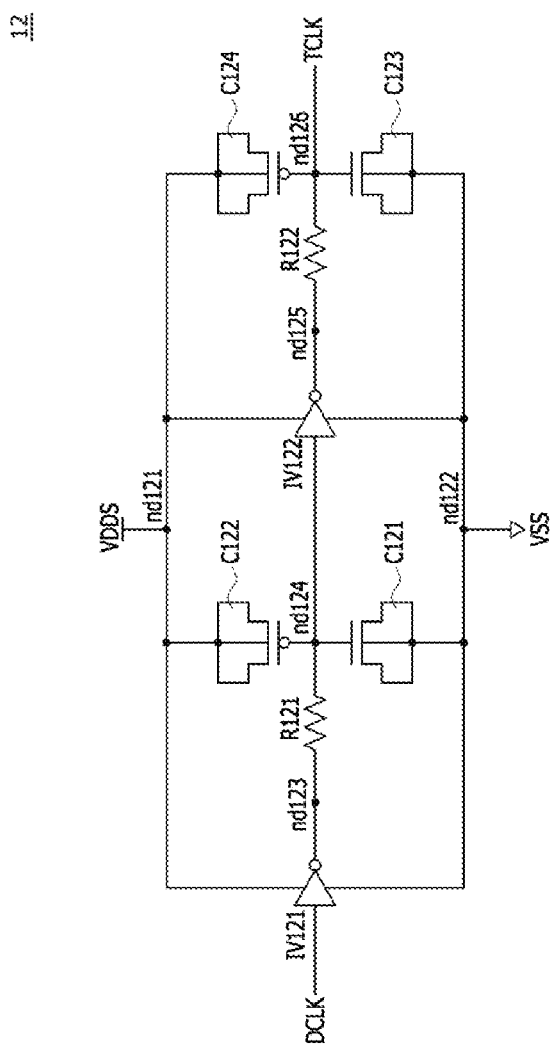
FIG. 5 is a detailed diagram of a test clock output circuit, such as that included in the test clock generation circuit shown in FIG. 2.

FIG. 5 is a detailed diagram of the test clock output circuit 12 included in the test clock generation circuit 1 shown in FIG. 2. Referring to FIG. 5, the test clock output circuit 12 may include inverters IV121 and IV122, resistors R121 and R122, and capacitors C121, C122, C123, and C124.

The inverter IV121 may receive the supply voltage VDDS and the ground voltage VSS to operate. The supply voltage VDDS may be supplied to a node nd121 serving as a supply voltage terminal (i.e., the terminal of the supply voltage VDDS), and the ground voltage VSS may be supplied to a node nd122 serving as a ground voltage terminal. The inverter IV121 may inversely buffer the delayed clock signal DCLK to output the inversely buffered signal of the delayed clock signal DCLK to a node nd123. The resistor R121 may be coupled between the node nd123 and a node nd124. The capacitor C121 may be coupled between the node nd124 and the node nd122. The capacitor C121 may be realized using an NMOS transistor of which a source terminal and a drain terminal are connected to the node nd122 having a level of the ground voltage VSS. The capacitor C122 may be coupled between the node nd124 and the node nd121. The capacitor C122 may be realized using a PMOS transistor of which a source terminal and a drain terminal are connected to the node nd121 having a level of the supply voltage VDDS.

The inverter IV122 may receive the supply voltage VDDS and the ground voltage VSS to operate, and may inversely buffer a signal of the node nd124 to output the inversely buffered signal of the signal of the node nd124 to a node nd125. The resistor R122 may be coupled between the node nd125 and a node nd126. The capacitor C123 may be coupled between the node nd126 and the node nd122. The capacitor C123 may be realized using an NMOS transistor of which a source terminal and a drain terminal are connected to the node nd122 having a level of the ground voltage VSS. The capacitor C124 may be coupled between the node nd126 and the node nd121. The capacitor C124 may be realized using a PMOS transistor of which a source terminal and a drain terminal are connected to the node nd121 having a level of the supply voltage VDDS.

The test clock output circuit 12 does not operate when the test mode is exited. This is because the supply voltage VDDS is not supplied to the test clock output circuit 12 when the test mode is exited. The test clock output circuit 12 may receive the supply voltage VDDS and the ground voltage VSS in the test mode, and may delay the delayed clock signal DCLK to generate the test clock signal TCLK.

Figure 6:
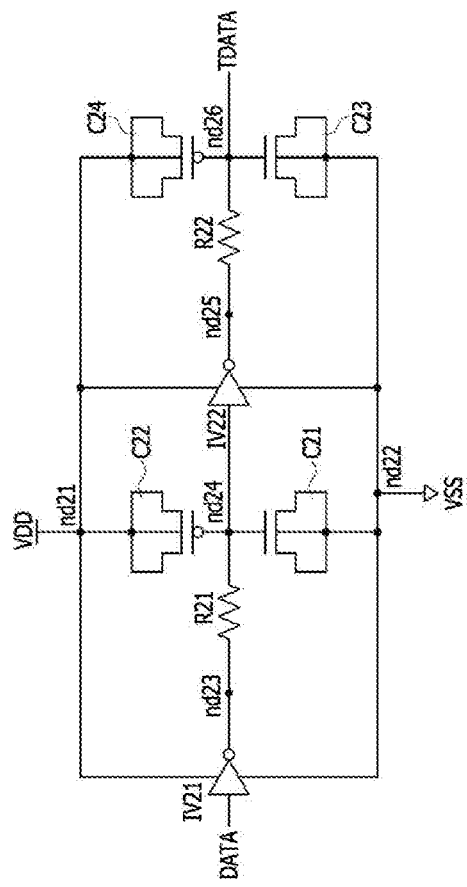
FIG. 6 is a detailed diagram of a test data generation circuit, such as that included in the semiconductor device shown in FIG. 1.

FIG. 6 is a detailed diagram of the test data generation circuit 2 included in the semiconductor device 100 shown in FIG. 1. Referring to FIG. 6, the test data generation circuit 2 may include inverters IV21 and IV22, resistors R21 and R22, and capacitors C21, C22, C23, and C24.

The inverter IV21 may receive the power source voltage VDD and the ground voltage VSS to operate. The power source voltage VDD may be supplied to a node nd21 serving as a power source voltage terminal, and the ground voltage VSS may be supplied to a node nd22 serving as a ground voltage terminal. The inverter IV21 may inversely buffer the data DATA to output the inversely buffered data of the data DATA to a node nd23. The resistor R21 may be coupled between the node nd23 and a node nd24. The capacitor C21 may be coupled between the node nd24 and the node nd22. The capacitor C21 may be realized using an NMOS transistor of which a source terminal and a drain terminal are connected to the node nd22 having a level of the ground voltage VSS. The capacitor C22 may be coupled between the node nd24 and the node nd21. The capacitor C22 may be realized using a PMOS transistor of which a source terminal and a drain terminal are connected to the node nd21 having a level of the power source voltage VDD.

The inverter IV22 may receive the power source voltage VDD and the ground voltage VSS to operate, and may inversely buffer a signal of the node nd24 to output the inversely buffered signal of the signal of the node nd24 to a node nd25. The resistor R22 may be coupled between the node nd25 and a node nd26. The test data TDATA may be outputted through the node nd26. The capacitor C23 may be coupled between the node nd26 and the node nd22. The capacitor C23 may be realized using an NMOS transistor of which a source terminal and a drain terminal are connected to the node nd22 having a level of the ground voltage VSS. The capacitor C24 may be coupled between the node nd26 and the node nd21. The capacitor C24 may be realized using a PMOS transistor of which a source terminal and a drain terminal are connected to the node nd21 having a level of the power source voltage VDD.

The test data generation circuit 2 may delay the data DATA to generate the test data TDATA. The test data generation circuit 2 may operate even when the test mode is exited. That is, the test data generation circuit 2 may operate in a normal mode as well as in the test mode. Thus, a pulse width of the test data TDATA may increase as the MOS transistors in the test data generation circuit 2 are degraded by the PVT variations and by the BTI phenomenon.

Figure 7:
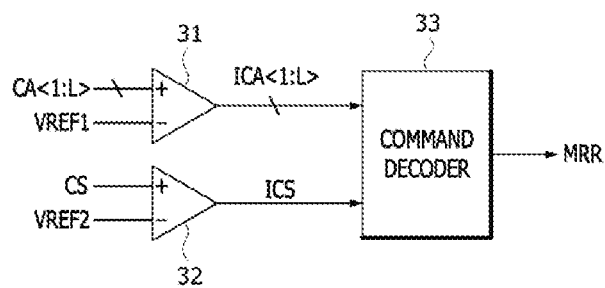
FIG. 7 is a detailed diagram of a command generation circuit, such as that included in the semiconductor device shown in FIG. 1.

FIG. 7 is a detailed diagram of the command generation circuit 3 included in the semiconductor device 100 shown in FIG. 1. Referring to FIG. 7, the command generation circuit 3 may include a first receivers 31, a second receiver 32, and a command decoder 33. In an embodiment, the first and second receivers 31 and 32 may be comparators.

The first receivers 31 may buffer the first to $L^{th}$ information signals CA<1:L> based on the first reference voltage VREF1 to generate first to $L^{th}$ internal information signals ICA<1:L>. Each of the first receivers 31 may output a signal having a logic "high" level when a corresponding level of the first to $L^{th}$ information signals CA<1:L> is higher than a level of the first reference voltage VREF1, and may output a signal having a logic "low" level when the corresponding level of the first to $L^{th}$ information signals CA<1:L> is lower than a level of the first reference voltage VREF1. The number of first receivers 31 is equal to the number "L" of the first to $L^{th}$ information signals CA<1:L>.

The second receiver 32 may buffer the chip selection signal CS based on the second reference voltage VREF2 to generate an internal chip selection signal ICS. The second receiver 32 may output a signal having a logic "high" level when a level of the chip selection signal CS is higher than a level of the second reference voltage VREF2, and may output a signal having a logic "low" level when a level of the chip selection signal CS is lower than a level of the second reference voltage VREF2. The first to $L^{th}$ information signals CA<1:L> may be inputted through address pads (not illustrated). The first and second reference voltages VREF1 and VREF2 may have the same level.

The command decoder 33 may generate the mode register read command MRR based on the internal chip selection signal ICS and the first to $L^{th}$ internal information signals ICA<1:L>. The command decoder 33 may generate the mode register read command MRR when the first to $L^{th}$ internal information signals ICA<1:L> have a predetermined code value and the internal chip selection signal ICS has a predetermined logic level.

Figure 8:
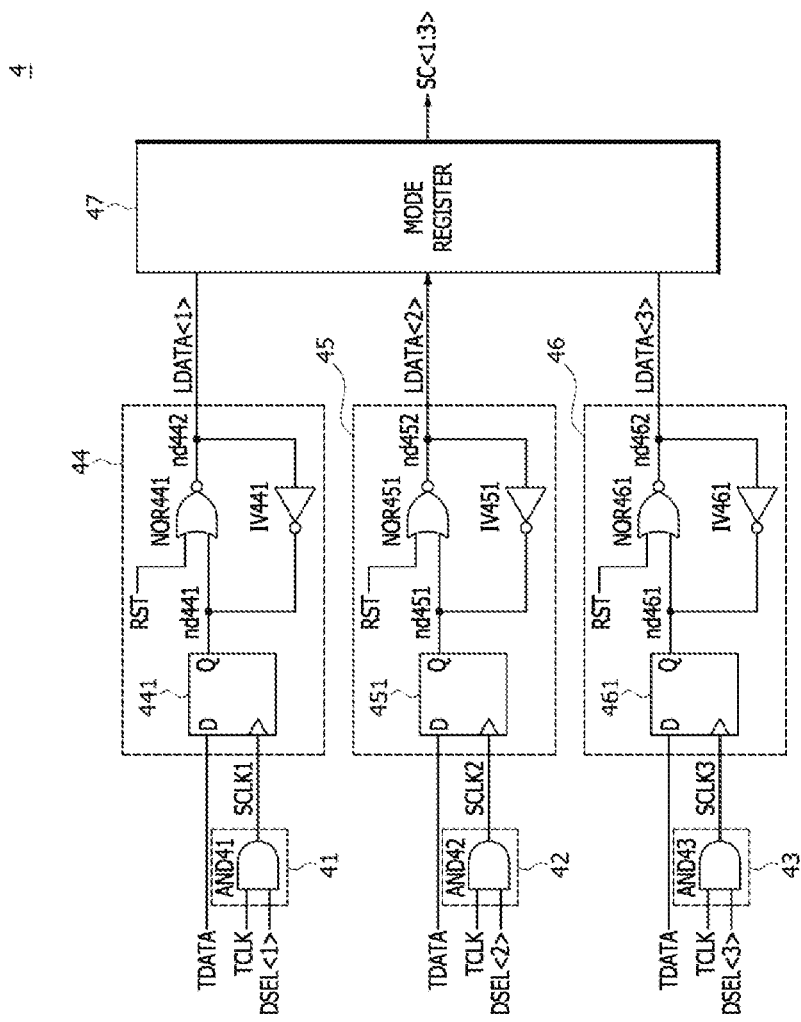
FIG. 8 is a detailed diagram of a control code generation circuit, such as that included in the semiconductor device shown in FIG. 1.

FIG. 8 is a detailed diagram of the control code generation circuit 4 included in the semiconductor device 100 shown in FIG. 1. Referring to FIG. 8, the control code generation circuit 4 may include a first selection clock generation circuit 41, a second selection clock generation circuit 42, a third selection clock generation circuit 43, a first latched data generation circuit 44, a second latched data generation circuit 45, a third latched data generation circuit 46, and a mode register 47.

The first selection clock generation circuit 41 may include an AND gate AND41. The AND gate AND41 may receive the test clock signal TCLK and the first delay selection signal DSEL<1> to perform a logical AND operation. The first selection clock generation circuit 41 may transfer the test clock signal TCLK to output as a first selection clock signal SCLK1 when the first delay selection signal DSEL<1> has a logic "high" level.

The second selection clock generation circuit 42 may include an AND gate AND42. The AND gate AND42 may receive the test clock signal TCLK and the second delay selection signal DSEL<2> to perform a logical AND operation. The second selection clock generation circuit 42 may transfer the test clock signal TCLK to output as a second selection clock signal SCLK2 when the second delay selection signal DSEL<2> has a logic "high" level.

The third selection clock generation circuit 43 may include an AND gate AND43. The AND gate AND43 may receive the test clock signal TCLK and the third delay selection signal DSEL<3> to perform a logical AND operation. The second selection clock generation circuit 43 may transfer the test clock signal TCLK to output as a third selection clock signal SCLK3 when the third delay selection signal DSEL<3> has a logic "high" level.

The first latched data generation circuit 44 may include a first flipflop (F/F) 441, a NOR gate NOR441, and an inverter IV441. The first F/F 441 may transfer the test data TDATA in synchronization with the first selection clock signal SCLK1 to a node nd441. The first F/F 441 may be realized using a D-flipflop. The NOR gate NOR441 may receive the reset signal RST and a signal of the node nd441 to perform a logical NOR operation. The reset signal RST may be activated to a logic "high" level to perform an initialization operation. The NOR gate NOR441 may output a first latched data LDATA<1> having a logic "low" level through a node nd442 when the reset signal RST has a logic "high" level or a signal of the node nd441 has a logic "high" level. The inverter IV441 may inversely buffer a signal of the node nd442 to output the inversely buffered signal of the signal of the node nd442 to the node nd441. That is, the NOR gate NOR441 and the inverter IV441 may form an inverter latch. The first latched data generation circuit 44 may latch the test data TDATA in response to the first selection clock signal SCLK1 to output as the first latched data LDATA<1>.

The second latched data generation circuit 45 may include a second F/F 451, a NOR gate NOR451, and an inverter IV451. The second F/F 451 may transfer the test data TDATA in synchronization with the second selection clock signal SCLK2 to a node nd451. The second F/F 451 may be realized using a D-flipflop. The NOR gate NOR451 may receive the reset signal RST and a signal of the node nd451 to perform a logical NOR operation. The NOR gate NOR451 may output a second latched data LDATA<2> having a logic "low" level through a node nd452 when the reset signal RST has a logic "high" level or a signal of the node nd451 has a logic "high" level. The inverter IV451 may inversely buffer a signal of the node nd452 to output the inversely buffered signal of the signal of the node nd452 to the node nd451. That is, the NOR gate NOR451 and the inverter IV451 may form an inverter latch. The second latched data generation circuit 45 may latch the test data TDATA in response to the second selection clock signal SCLK2 to output as the second latched data LDATA<2>.

The third latched data generation circuit 46 may include a third F/F 461, a NOR gate NOR461, and an inverter IV461. The third F/F 461 may transfer the test data TDATA in synchronization with the third selection clock signal SCLK3 to a node nd461. The third F/F 461 may be realized using a D-flipflop. The NOR gate NOR461 may receive the reset signal RST and a signal of the node nd461 to perform a logical NOR operation. The NOR gate NOR461 may output a third latched data LDATA<3> having a logic "low" level through a node nd462 when the reset signal RST has a logic "high" level or a signal of the node nd461 has a logic "high" level. The inverter IV461 may inversely buffer a signal of the node nd462 to output the inversely buffered signal of the signal of the node nd462 to the node nd461. That is, the NOR gate NOR461 and the inverter IV461 may form an inverter latch. The third latched data generation circuit 46 may latch the test data TDATA in response to the third selection clock signal SCLK3 to output as the third latched data LDATA<3>.

The mode register 47 may generate the first to third control codes SC<1:3> from the first to third latched data LDATA<1:3>. The mode register 47 may receive and store the first to third latched data LDATA<1:3> to output as the first to third control codes SC<1:3>.

The control code generation circuit 4 may latch and store the test data TDATA in response to the test clock TCLK and the first to third delay selection signals DSEL<1:3>, and may generate the first to third control codes SC<1:3> based on the stored test data TDATA.

Figure 9:
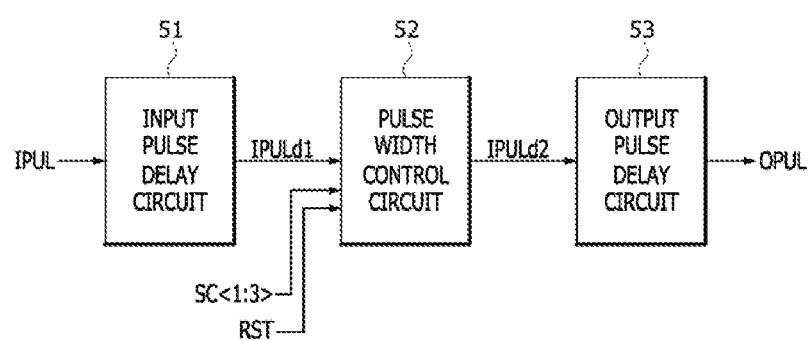
FIG. 9 is a detailed diagram of a pulse delay circuit such as that included in the semiconductor device shown in FIG. 1.

FIG. 9 is a detailed diagram of the pulse delay circuit 5 included in the semiconductor device 100 shown in FIG. 1. Referring to FIG. 9, the pulse delay circuit 5 may include an input pulse delay circuit 51, a pulse width control circuit 52, and an output pulse delay circuit 53.

The input pulse delay circuit 51 may delay the internal pulse signal IPUL to generate a first delayed internal pulse signal IPULd1. The input pulse delay circuit 51 may be realized using an R-C delay circuit.

The pulse width control circuit 52 may receive the first delayed internal pulse signal IPULd1, and may generate a second delayed internal pulse signal IPULd2 in response to the first to third control codes SC<1:3> and the reset signal RST. The pulse width control circuit 52 may delay the first delayed internal pulse signal IPULd1 to generate the second delayed internal pulse signal IPULd2. A pulse width of the second delayed internal pulse signal IPULd2 is controlled by a code value of the first to third control codes SC<1:3>.

The output pulse delay circuit 53 may delay the second delayed internal pulse signal IPULd2 to generate the output pulse signal OPUL. The output pulse delay circuit 53 may be realized using an R-C delay circuit.

The pulse delay circuit 5 may delay the internal pulse signal IPUL to generate the output pulse signal OPUL. A pulse width of the output pulse signal OPUL is controlled by the first to third control codes SC<1:3>.

Figure 10:
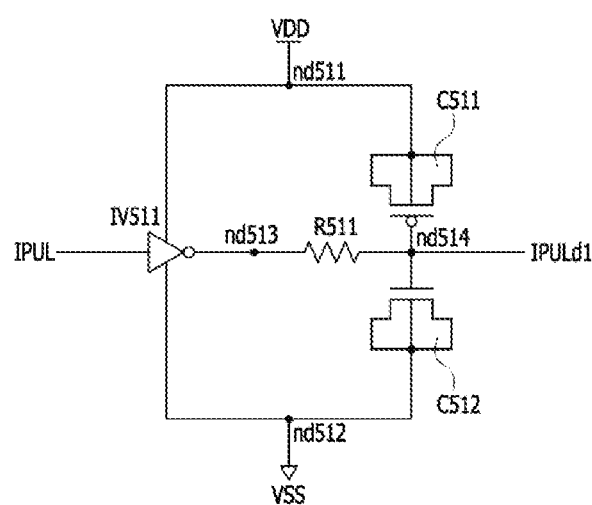
FIG. 10 is a detailed diagram of an input pulse delay circuit, such as that included in the pulse delay circuit shown in FIG. 9.

FIG. 10 is a detailed diagram of the input pulse delay circuit 51 included in the pulse delay circuit 5 shown in FIG. 9. Referring to FIG. 10, the input pulse delay circuit 51 may include an inverter IV511, a resistor R511, and capacitors C511 and C512.

The inverter IV511 may receive the power source voltage VDD and the ground voltage VSS to operate. The power source voltage VDD may be supplied to a node nd511 serving as a power source voltage terminal, and the ground voltage VSS may be supplied to a node nd512 serving as a ground voltage terminal. The inverter IV511 may inversely buffer the internal pulse signal IPUL to output the inversely buffered signal of the internal pulse signal IPUL to a node nd513. The resistor R511 may be coupled between the node nd513 and a node nd514. The capacitor C511 may be coupled between the node nd514 and the node nd511. The capacitor C511 may be realized using a PMOS transistor of which a source terminal and a drain terminal are connected to the node nd511 having a level of the power source voltage VDD. The capacitor C512 may be coupled between the node nd514 and the node nd512. The capacitor C512 may be realized using an NMOS transistor, of which a source terminal and a drain terminal are connected to the node nd512 having a level of the ground voltage VSS. The input pulse delay circuit 51 may delay the internal pulse signal IPUL by a delay amount determined by a resistance of the resistor R511 and capacitance of the capacitors C511 and C512, to generate and output the first delayed internal pulse signal IPULd1 through the node nd514.

Figure 11:
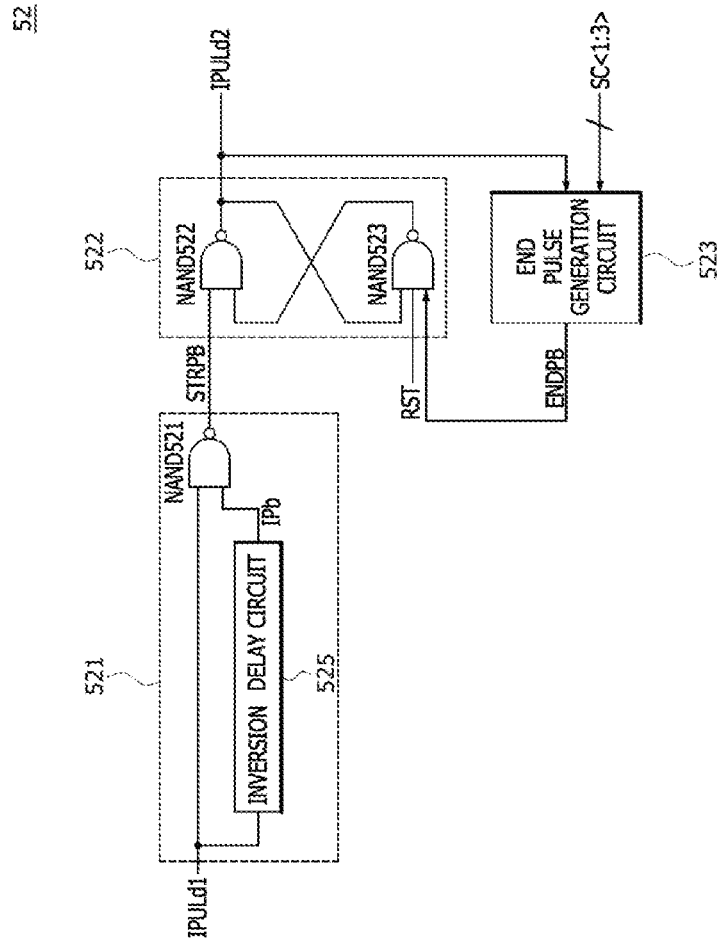
FIG. 11 is a detailed diagram of a pulse width control circuit, such as that included in the pulse delay circuit shown in FIG. 9.

FIG. 11 is a detailed diagram of the pulse width control circuit 52 included in the pulse delay circuit 5 shown in FIG. 9. Referring to FIG. 11, the pulse width control circuit 52 may include a start pulse generation circuit 521, a delayed pulse output circuit 522, and an end pulse generation circuit 523.

The start pulse generation circuit 521 may include an inversion delay circuit 525 and a NAND gate NAND521. The inversion delay circuit 525 may invert and delay the first delayed internal pulse signal IPULd1 to generate an inverted pulse signal IPb. The NAND gate NAND521 may receive the inverted pulse signal IPb and the first delayed internal pulse signal IPULd1, and may perform a logical NAND operation on the inverted pulse signal IPb and the first delayed internal pulse signal IPULd1 to generate a start pulse signal STRPB. The start pulse signal STRPB may be activated to a logic "low" level at a rising edge of the first delayed internal pulse signal IPULd1, with a pulse width corresponding to a delay amount of the inversion delay circuit 525. In some other embodiments, the start pulse signal STRPB may be activated to a logic "high" level.

The delayed pulse output circuit 522 may include NAND gates NAND522 and NAND523 which are cross-coupled to form a SR latch. The NAND gate NAND522 may perform a logical NAND operation on the start pulse signal STRPB and an output signal of the NAND gate NAND523 to generate the second delayed internal pulse signal IPULd2. The NAND gate NAND523 perform a logical NAND operation on an output signal (i.e., the second delayed internal pulse signal IPULd2) of the NAND gate NAND522, the reset signal RST, and an end pulse signal ENDPB. That is, the start pulse signal STRPB may serve as a set signal of the SR latch, and the reset signal RST and an end pulse signal ENDPB may serve as a reset input of the SR latch.

The end pulse generation circuit 523 may receive the second delayed internal pulse signal IPULd2, and may generate the end pulse signal ENDPB in response to the first to third control codes SC<1:3>. The end pulse signal ENDPB may be activated when the second delayed internal pulse signal IPULd2 is activated until a delay amount determined by the first to third control codes SC<1:3> elapses. For example, the end pulse signal ENDPB may be activated to a logic "low" level when the second delayed internal pulse signal IPULd2 is activated to a logic "high" level. In some other embodiments, the end pulse signal ENDPB may be activated to a logic "high" level when the second delayed internal pulse signal IPULd2 is activated to a logic "low" level.

The pulse width control circuit 52 may delay the first delayed internal pulse signal IPULd1 to generate the second delayed internal pulse signal IPULd2. A pulse width of the second delayed internal pulse signal IPULd2 is controlled by a code value of the first to third control codes SC<1:3>.

Figure 12:
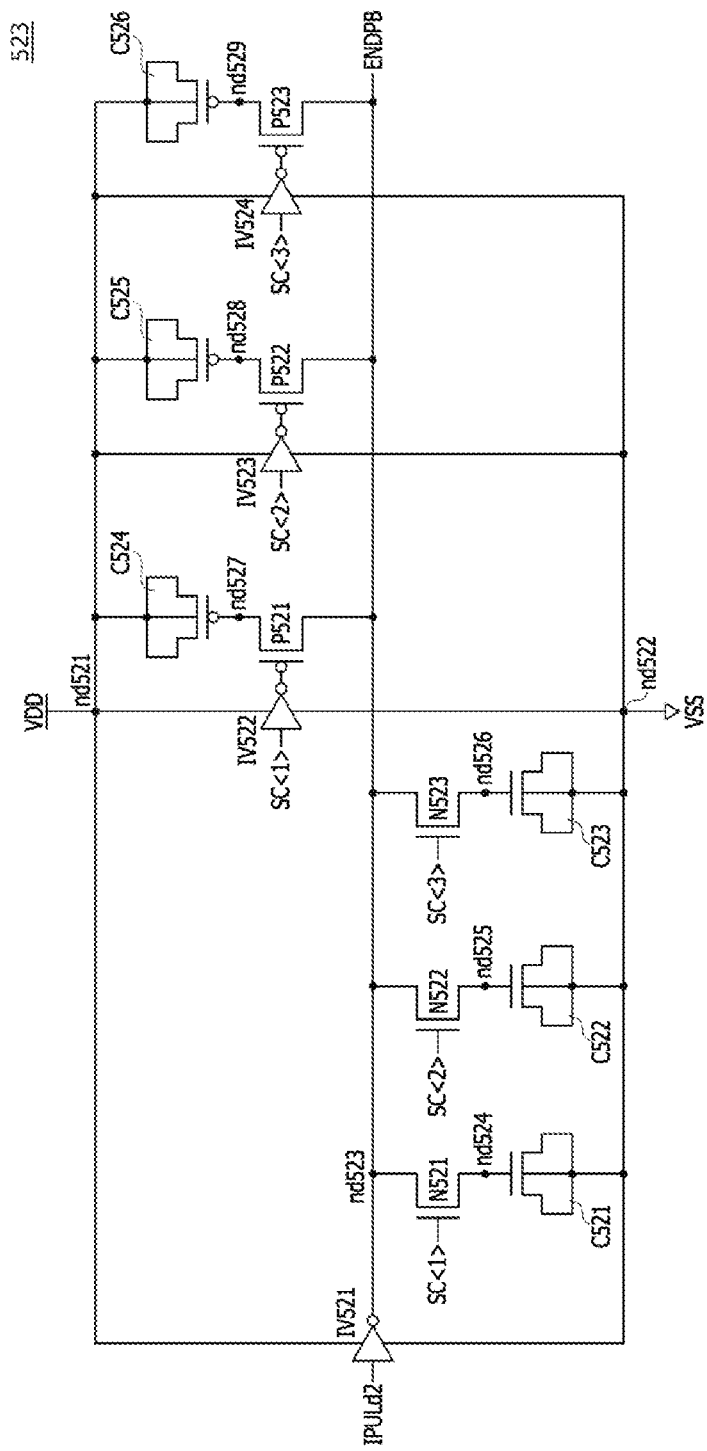
FIG. 12 is a detailed diagram of an end pulse generation circuit, such as that included in the pulse width control circuit shown in FIG. 11.

FIG. 12 is a detailed diagram of the end pulse generation circuit 523 included in the pulse width control circuit 52 shown in FIG. 11. Referring to FIG. 12, the end pulse generation circuit 523 may include inverters IV521, IV522, IV523, and IV524, NMOS transistors N521, N522, and N523, capacitors C521, C522, C523, C524, C525, and C526, and PMOS transistors P521, P522, and P523.

The inverter IV521 may receive the power source voltage VDD and the ground voltage VSS to operate. The power source voltage VDD may be supplied to a node nd521 serving as a power source voltage terminal, and the ground voltage VSS may be supplied to a node nd522 serving as a ground voltage terminal. The inverter IV521 may inversely buffer the second delayed internal pulse signal IPULd2 to output the inversely buffered signal of the second delayed internal pulse signal IPULd2 to a node nd523. The inverter IV522 may receive the power source voltage VDD and the ground voltage VSS to operate to inversely buffer the first control code SC<1>. The inverter IV523 may receive the power source voltage VDD and the ground voltage VSS to operate to inversely buffer the second control code SC<2>. The inverter IV524 may receive the power source voltage VDD and the ground voltage VSS to operate to inversely buffer the third control code SC<3>.

The NMOS transistor N521 may be coupled between the node nd523 and a node nd524, and may be turned on when the first control code SC<1> has a logic "high" level. The capacitor C521 may be coupled between the node nd524 and the node nd522. The capacitor C521 may be realized using an NMOS transistor of which a source terminal and a drain terminal are connected to the node nd522 having a level of the ground voltage VSS. The NMOS transistor N522 may be coupled between the node nd523 and a node nd525, and may be turned on when the second control code SC<2> has a logic "high" level. The capacitor C522 may be coupled between the node nd525 and the node nd522. The capacitor C522 may be realized using an NMOS transistor of which a source terminal and a drain terminal are connected to the node nd522 having a level of the ground voltage VSS. The NMOS transistor N523 may be coupled between the node nd523 and a node nd526, and may be turned on when the third control code SC<3> has a logic "high" level. The capacitor C523 may be coupled between the node nd526 and the node nd522. The capacitor C523 may be realized using an NMOS transistor of which a source terminal and a drain terminal are connected to the node nd522 having a level of the ground voltage VSS.

The PMOS transistor P521 may be coupled between the node nd523 and a node nd527, and may be turned on by an output signal (having a logic "low" level) of the inverter IV522 when the first control code SC<1> has a logic "high" level. The capacitor C524 may be coupled between the node nd527 and the node nd521. The capacitor C524 may be realized using a PMOS transistor of which a source terminal and a drain terminal are connected to the node nd521 having a level of the power source voltage VDD. The PMOS transistor P522 may be coupled between the node nd523 and a node nd528, and may be turned on by an output signal (having a logic "low" level) of the inverter IV523 when the second control code SC<2> has a logic "high" level. The capacitor 525 may be coupled between the node nd528 and the node nd521. The capacitor C525 may be realized using a PMOS transistor of which a source terminal and a drain terminal are connected to the node nd521 having a level of the power source voltage VDD. The PMOS transistor P523 may be coupled between the node nd523 and a node nd529, and may be turned on by an output signal (having a logic "low" level) of the inverter IV524 when the third control code SC<3> has a logic "high" level. The capacitor 526 may be coupled between the node nd529 and the node nd521. The capacitor C526 may be realized using a PMOS transistor of which a source terminal and a drain terminal are connected to the node nd521 having a level of the power source voltage VDD.

The end pulse generation circuit 523 may generate the end pulse signal ENDPB at a point in time when a delay period set by the first to third control codes SC<1:3> elapses from a point in time when the second delayed internal pulse signal IPULd2 is generated. The end pulse generation circuit 523 may generate the end pulse signal ENDPB having a logic "low" level at a point in time when a delay period set by the first to third control codes SC<1:3> elapses from a point in time when the second delayed internal pulse signal IPULd2 is generated to have a logic "high" level.

Figure 13:
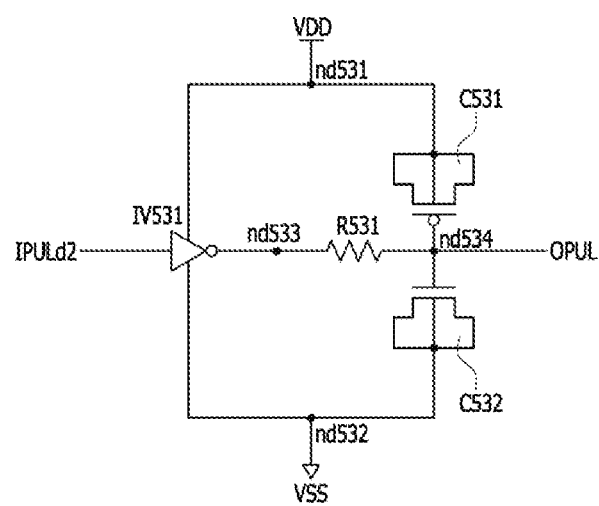
FIG. 13 is a detailed diagram of an output pulse delay circuit, such as that included in the pulse delay circuit shown in FIG. 9.

FIG. 13 is a detailed diagram of the output pulse delay circuit 53 included in the pulse delay circuit 5 shown in FIG. 9. Referring to FIG. 13, the output pulse delay circuit 53 may include an inverter IV531, a resistor R531, and capacitors C531 and C532.

The inverter IV531 may receive the power source voltage VDD and the ground voltage VSS to operate. The power source voltage VDD may be supplied to a node nd531 serving as a power source voltage terminal, and the ground voltage VSS may be supplied to a node nd532 serving as a ground voltage terminal. The inverter IV531 may inversely buffer the second delayed internal pulse signal IPULd2 to output the inversely buffered signal of the second delayed internal pulse signal IPULd2 to a node nd533. The resistor R531 may be coupled between the node nd533 and a node nd534. The capacitor C531 may be coupled between the node nd534 and the node nd531. The capacitor C531 may be realized using a PMOS transistor of which a source terminal and a drain terminal are connected to the node nd531 having a level of the power source voltage VDD. The capacitor C532 may be coupled between the node nd534 and the node nd532. The capacitor C532 may be realized using an NMOS transistor of which a source terminal and a drain terminal are connected to the node nd532 having a level of the ground voltage VSS. The output pulse delay circuit 53 may delay the second delayed internal pulse signal IPULd2 by a delay amount determined by a resistance of the resistor R531 and capacitance of the capacitors C531 and C532, to generate and output the output pulse signal OPUL through the node nd534.

Operations of the semiconductor device 100 having the aforementioned configuration will be described hereinafter with reference to FIGS. 14 to 16.

The supply voltage VDDS may be driven to the power source voltage VDD when the test enablement signal TENB is activated to a logic "low" level when entering the test mode for compensating for degradation of the MOS transistors due to the BTI phenomenon.

Figure 14:
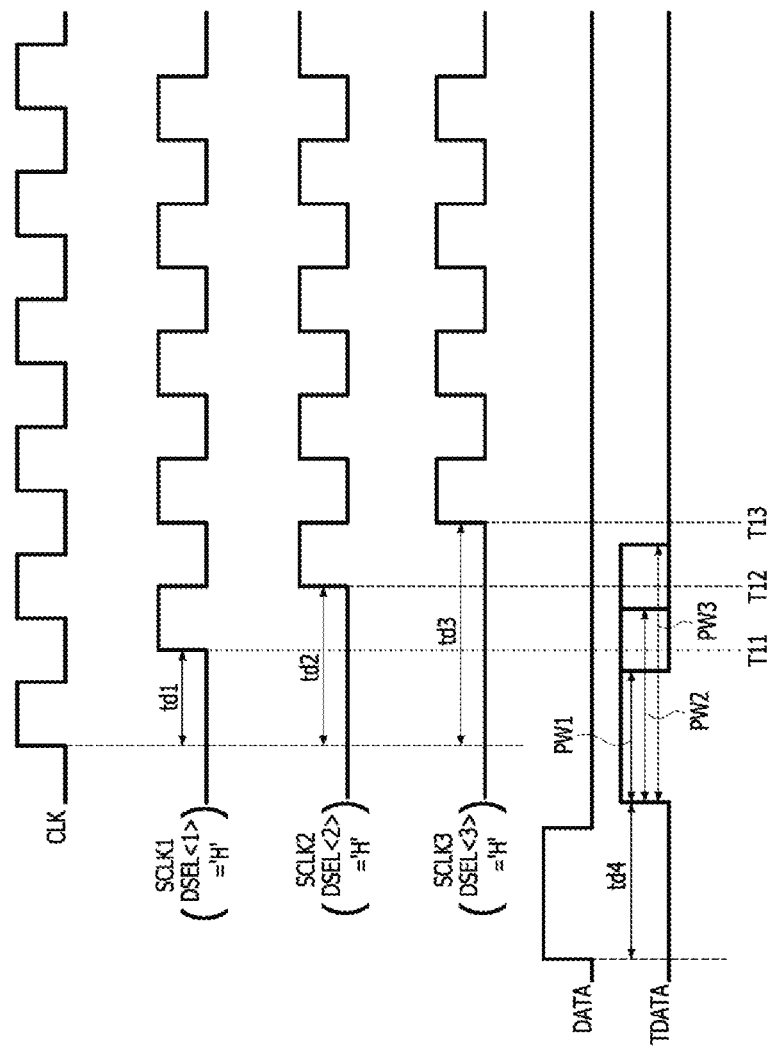
FIGS. 14 to 16 are timing diagrams for describing operations of the semiconductor device shown in FIGS. 1 to 13.

Referring to FIG. 14, when the supply voltage VDDS is supplied to the test clock output circuit 12 in the test mode, the clock signal CLK may be delayed by a delay amount controlled by a code value of the first to third delay selection signals DSEL<1:3> to generate the test clock signal TCLK. When the first delay selection signal DSEL<1> has a logic "high" level and the second and third delay selection signals DSEL<2:3> have a logic "low" level, the clock signal CLK may be delayed by a first delay amount "td1" to generate the first selection clock signal SCLK1. When the second delay selection signal DSEL<2> has a logic "high" level and the first and third delay selection signals DSEL<1> and DSEL<3> have a logic "low" level, the clock signal CLK may be delayed by a second delay amount "td2" to generate and output the second selection clock signal SCLK2. When the third delay selection signal DSEL<3> has a logic "high" level and the first and second delay selection signals DSEL<1:2> have a logic "low" level, the clock signal CLK may be delayed by a third delay amount "td3" to generate and output the third selection clock signal SCLK3. A pulse width of the test clock signal TCLK may increase as the MOS transistors in the test clock generation circuit 1 are degraded by the PVT variations.

The data DATA may be delayed to generate the test data TDATA. A pulse width of the test data TDATA may increase to sequentially have a first pulse width PW1, a second pulse width PW2, and a third pulse width PW3 as the MOS transistors in the test data generation circuit 2 are degraded by the PVT variations and by the BTI phenomenon.

When the test data TDATA has the first pulse width PW1, the test data TDATA having a logic "low" level may be latched at a point in time "T11" when the first selection clock signal SCLK1 toggles and the first control code SC<1> may be determined based on the latched test data TDATA. In the present embodiment, the first control code SC<1> may be determined to have a logic "high" level corresponding to an inverted logic level of the latched test data TDATA. When the test data TDATA has the first pulse width PW1, the test data TDATA having a logic "low" level may be latched at a point in time "T12" when the second selection clock signal SCLK2 toggles and the second control code SC<2> may be determined based on the latched test data TDATA. In the present embodiment, the second control code SC<2> may be generated to have a logic "high" level corresponding to an inverted logic level of the latched test data TDATA. When the test data TDATA has the first pulse width PW1, the test data TDATA having a logic "low" level may be latched at a point in time "T13" when the third selection clock signal SCLK3 toggles and the third control code SC<3> may be determined based on the latched test data TDATA. In the present embodiment, the third control code SC<3> may be generated to have a logic "high" level corresponding to an inverted logic level of the latched test data TDATA. As a result, when the test data TDATA has the first pulse width PW1, the first to third control codes SC<1:3> may be generated to have a code value of '111'. In the first to third control codes SC<1:3>, the code value of '111' means that all of the first to third control codes SC<1:3> are generated to have a logic "high" level.

When the test data TDATA has the second pulse width PW2, the test data TDATA having a logic "high" level may be latched at the point in time "T11" when the first selection clock signal SCLK1 toggles and the first control code SC<1> may be determined based on the latched test data TDATA. In the present embodiment, the first control code SC<1> may be generated to have a logic "low" level corresponding to an inverted logic level of the latched test data TDATA. When the test data TDATA has the second pulse width PW2, the test data TDATA having a logic "low" level may be latched at the point in time "T12" when the second selection clock signal SCLK2 toggles and the second control code SC<2> may be determined based on the latched test data TDATA. In the present embodiment, the second control code SC<2> may be generated to have a logic "high" level corresponding to an inverted logic level of the latched test data TDATA. When the test data TDATA has the second pulse width PW2, the test data TDATA having a logic "low" level may be latched at the point in time "T13" when the third selection clock signal SCLK3 toggles and the third control code SC<3> may be determined based on the latched test data TDATA. In the present embodiment, the third control code SC<3> may be generated to have a logic "high" level corresponding to an inverted logic level of the latched test data TDATA. As a result, when the test data TDATA has the second pulse width PW2, the first to third control codes SC<1:3> may be generated to have a code value of '011'. In the first to third control codes SC<1:3>, the code value of '011' means that the first control code SC<1> is generated to have a logic "low" level and the second and third control codes SC<2:3> are generated to have a logic "high" level.

When the test data TDATA has the third pulse width PW3, the test data TDATA having a logic "high" level may be latched at the point in time "T11" when the first selection clock signal SCLK1 toggles and the first control code SC<1> may be determined based on the latched test data TDATA. In the present embodiment, the first control code SC<1> may be generated to have a logic "low" level corresponding to an inverted logic level of the latched test data TDATA. When the test data TDATA has the third pulse width PW3, the test data TDATA having a logic "high" level may be latched at the point in time "T12" when the second selection clock signal SCLK2 toggles and the second control code SC<2> may be determined based on the latched test data TDATA. In the present embodiment, the second control code SC<2> may be generated to have a logic "low" level corresponding to an inverted logic level of the latched test data TDATA. When the test data TDATA has the third pulse width PW3, the test data TDATA having a logic "low" level may be latched at the point in time "T13" when the third selection clock signal SCLK3 toggles and the third control code SC<3> may be determined based on the latched test data TDATA. In the present embodiment, the third control code SC<3> may be generated to have a logic "high" level corresponding to an inverted logic level of the latched test data TDATA. As a result, when the test data TDATA has the third pulse width PW3, the first to third control codes SC<1:3> may be generated to have a code value of '001'.

Figure 15:
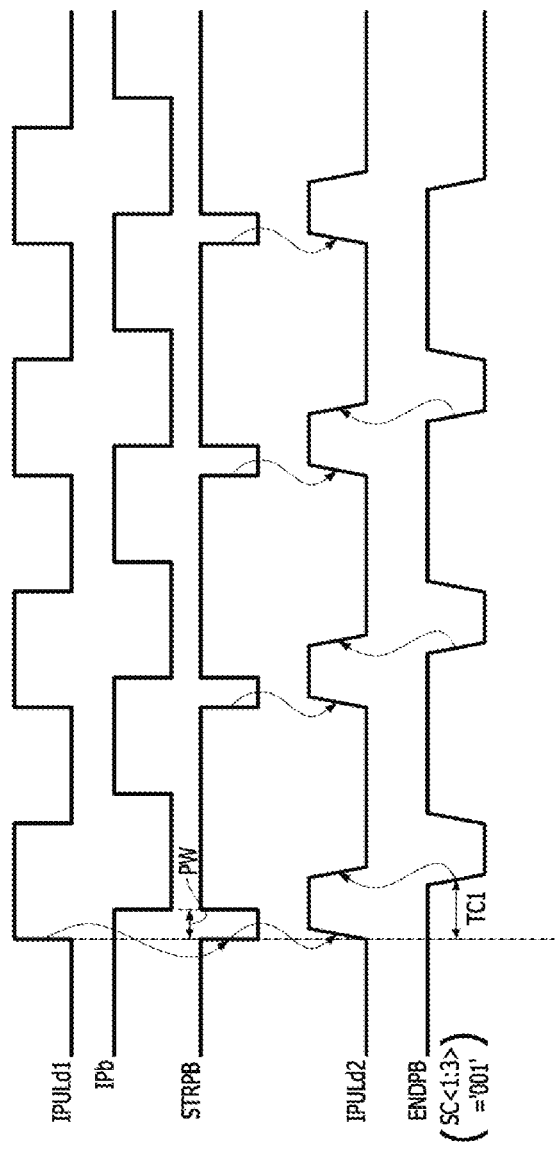

Referring to FIG. 15, an operation that the second delayed internal pulse signal IPULd2 is generated based on the first delayed internal pulse signal IPULd1 is illustrated when the test data TDATA has the third pulse width PW3. The first delayed internal pulse signal IPULd1 may be inverted and delayed to generate the inverted pulse signal IPb, and the start pulse signal STRPB may be activated to a logic "low" level when the first delayed internal pulse signal IPULd1 is activated to a logic "high" level. The start pulse signal STRPB may be deactivated to a logic "high" level when a logic level of the inverted pulse signal IPb changes from a logic "high" level into a logic "low" level. A period "PW" may denote a pulse width of the start pulse signal STRPB. The second delayed internal pulse signal IPULd2 may be activated to a logic "high" level in synchronization with a falling edge of the start pulse signal STRPB. When the test data TDATA has the third pulse width PW3, the end pulse signal ENDPB may be activated to a logic "low" level at a point in time when a first controlled delay amount TC1 elapses from a point in time when the second delayed internal pulse signal IPULd2 is activated because the first to third control codes SC<1:3> are generated to have the code value of '001'. A pulse width of the second delayed internal pulse signal IPULd2 may be set as the first controlled delay amount TC1 determined by the first to third control codes SC<1:3> because the second delayed internal pulse signal IPULd2 is deactivated to a logic "low" level in response to the end pulse signal ENDPB activated to a logic "low" level.

Figure 16:
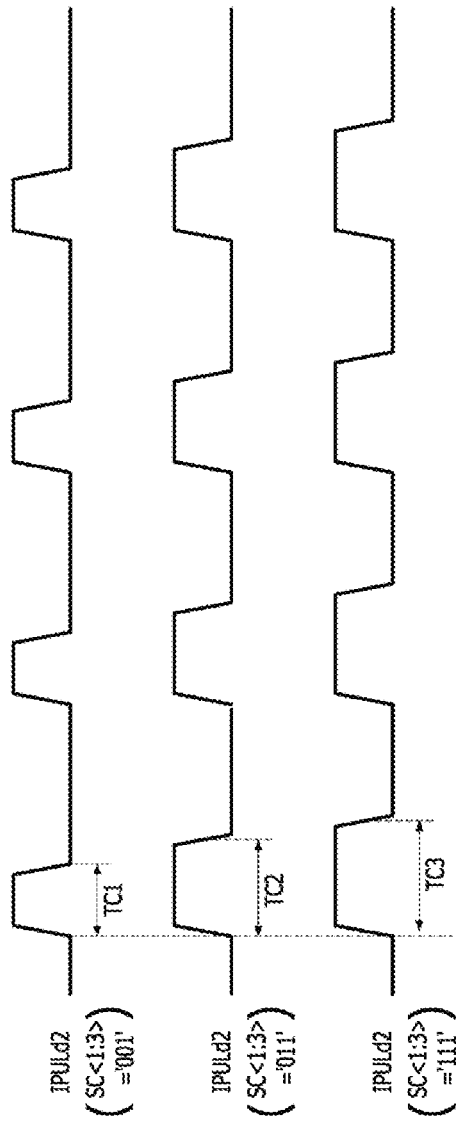

Referring to FIG. 16, various pulse widths of the second delayed internal pulse signal IPULd2 controlled according to a code value of the first to third control codes SC<1:3> are illustrated. A pulse width of the second delayed internal pulse signal IPULd2 may be set as the first controlled delay amount TC1 when the first to third control codes SC<1:3> are set to have a code value of '001'. A pulse width of the second delayed internal pulse signal IPULd2 may be set as a second controlled delay amount TC2 when the first to third control codes SC<1:3> are set to have a code value of '011'. A pulse width of the second delayed internal pulse signal IPULd2 may be set as a third controlled delay amount TC3 when the first to third control codes SC<1:3> are set to have a code value of '111'. The third controlled delay amount TC3 may be set greater than the second controlled delay amount TC2, and the second controlled delay amount TC2 may be set greater than the first controlled delay amount TC1. When the first to third control codes SC<1:3> are set as a code value of '001', it may be determined that the MOS transistors may have a state degraded due to the BTI phenomenon more severely than a case where the first to third control codes SC<1:3> are set as a code value of '011'. When the first to third control codes SC<1:3> are set as a code value of '011', it may be determined that the MOS transistors may have a state degraded due to the BTI phenomenon more severely than a case where the first to third control codes SC<1:3> are set as a code value of '111'. Thus, if the MOS transistors are more severely degraded due to the BTI phenomenon, a pulse width of the second delayed internal pulse signal IPULd2 may be reduced to suppress that a pulse width of the output pulse signal OPUL outputted from the pulse delay circuit 5 increases because of the BTI phenomenon.

As describe above, a semiconductor device according to an embodiment may monitor the degradation of MOS transistors only due to the BTI phenomenon, while excluding degradation by the PVT variations, to extract the first to third control codes SC<1:3>, and may control a pulse width of the output pulse signal OPUL with the first to third control codes SC<1:3> to suppress that a pulse width of the output pulse signal OPUL increases due to the BTI phenomenon.

Figure 17:
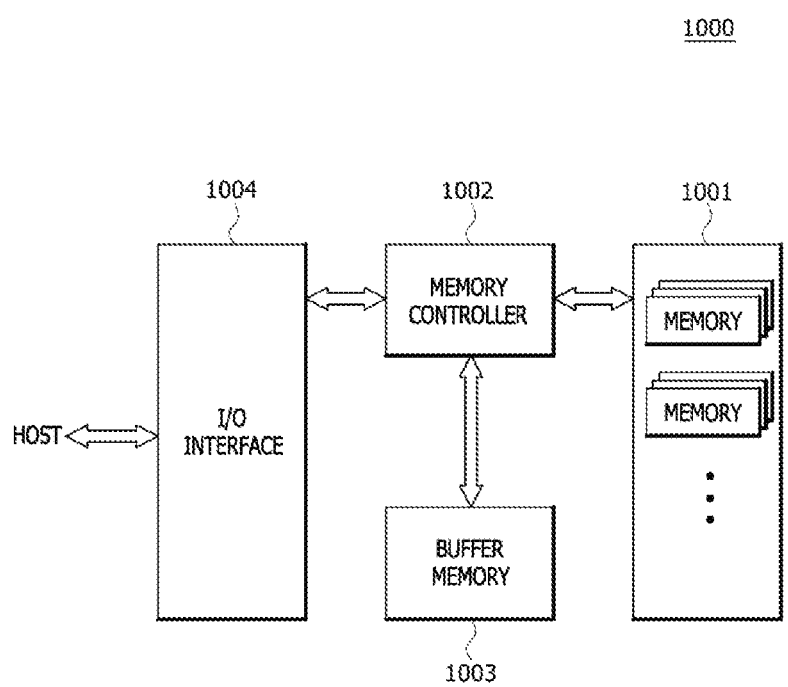
FIG. 17 is a block diagram illustrating an electronic system employing the semiconductor device illustrated in FIG. 1.

The semiconductor device 100 described with reference to FIGS. 1 to 16 may be applied to an electronic system that includes a memory system, a graphic system, a computing system, a mobile system, or the like. For example, as illustrated in FIG. 17, an electronic system 1000 according to an embodiment may include a data storage device 1001, a memory controller 1002, a buffer memory 1003, and an input/output (I/O) interface 1004.

The data storage device 1001 may store data which are outputted from the memory controller 1002 or may read and output the stored data to the memory controller 1002, according to a control signal outputted from the memory controller 1002. The data storage device 1001 may include the semiconductor device 100 illustrated in FIG. 1. Meanwhile, the data storage device 1001 may include a plurality of nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage device 1001 or the buffer memory 1003 or for outputting the data stored in the data storage circuit 1001 or the buffer memory 1003. Although FIG. 17 illustrates the memory controller 1002 with a single block, the memory controller 1002 may include one controller for controlling the data storage device 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage device 1001. The buffer memory 1003 may store the data, which are outputted from the memory controller 1002, according to a control signal. The buffer memory 1003 may read out the data stored therein and may output the data to the memory controller 1002. The buffer memory 1003 may include the semiconductor device 100 illustrated in FIG. 1. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device through the I/O interface 1004 and may output the data outputted from the memory controller 1002 to the external device through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a test clock generation circuit configured to delay a clock signal based on a delay selection signal in a test mode to generate a test clock signal;
    a test data generation circuit configured to delay data irrespective of delay selection signal to generate test data; and
    a control code generation circuit configured to latch the test data based on the delay selection signal and the test clock signal to generate a control code,
    wherein the test clock generation circuit receives a power source voltage to operate, in response to a test enablement signal activated in the test mode.

2. The semiconductor device of claim 1, wherein the test clock signal is generated by delaying the clock signal by a delay amount determined based on the delay selection signal.

3. The semiconductor device of claim 1, wherein the test clock generation circuit includes a power supply control circuit configured to drive a terminal of a supply voltage with a power source voltage in response to a test enablement signal.

4. The semiconductor device of claim 3, wherein the test clock generation circuit further includes:
    a delayed clock generation circuit configured to receive the supply voltage, and delay the clock signal by a delay amount determined based on the delay selection signal to generate a delayed clock signal; and
    a test clock output circuit configured to receive the supply voltage, and generate the test clock signal based on the delayed clock signal.

5. The semiconductor device of claim 4,
    wherein the delay selection signal includes a first delay selection signal and a second delay selection signal; and
    wherein the delayed clock generation circuit includes a first capacitor for setting the delay period according to the first delay selection signal and a second capacitor for setting the delay period according to the second delay selection signal.

6. The semiconductor device of claim 4, wherein the test clock output circuit includes a resistor and a capacitor.

7. The semiconductor device of claim 1, wherein the test data generation circuit includes a resistor and a capacitor, and receives a power source voltage to operate.

8. The semiconductor device of claim 1, wherein the control code generation circuit includes:
    a latched data generation circuit configured to latch the test data based on the delay selection signal and the test clock signal; and
    a mode register configured to store the latched test data to output as a control code.

9. The semiconductor device of claim 8, wherein the latched data generation circuit is configured to initialize the latched test data when a reset signal is generated to perform an initialization operation.

10. The semiconductor device of claim 1, further comprising a transmitter configured to output the control code through an output pad, in response to a mode register read command.

11. The semiconductor device of claim 1, further comprising a pulse delay circuit configured to delay an internal pulse signal to generate an output pulse signal having a pulse width controlled based on the control code.

12. The semiconductor device of claim 11, wherein the pulse delay circuit includes:

an input pulse delay circuit configured to delay the internal pulse signal to generate a first delayed internal pulse signal; and a pulse width control circuit configured to generate a second delayed internal pulse signal based on the first delayed internal pulse signal, wherein a pulse width of the second delayed internal pulse signal is controlled based on the control code.

13. The semiconductor device of claim 12, wherein the pulse width control circuit includes:

a start pulse generation circuit configured to generate a start pulse signal based on the first delayed internal pulse signal;

a delayed pulse output circuit configured to generate the second delayed internal pulse signal in response to the start pulse signal and an end pulse signal; and an end pulse generation circuit configured to generate the end pulse signal based on the second delayed internal pulse signal.

* * * * *